US010869409B1

(12) United States Patent
Osterkamp et al.

(10) Patent No.: US 10,869,409 B1

(45) Date of Patent: Dec. 15, 2020

(54) COOLING SYSTEM FOR RACK MOUNTED ELECTRONIC COMPONENTS

(71) Applicant: UIPCO, LLC, San Antonio, TX (US)

(72) Inventors: Bryan J. Osterkamp, New Braunfels, TX (US); Ryan Thomas Russell, San Antonio, TX (US); William Preston Culbertson, II, San Antonio, TX (US); Nathan Lee Post, San Antonio, TX (US); Courtney St. Martin, Roswell, GA (US); Ashley Raine Philbrick, San Antonio, TX (US)

(73) Assignee: UNITED SERVICES AUTOMOBILE ASSOCIATION (USAA), San Antonio, TX (US)

( * ) Notice: Subject to any disclaimer, the term of this patent is extended or adjusted under 35 U.S.C. 154(b) by 0 days.

(21) Appl. No.: 16/593,857

(22) Filed: Oct. 4, 2019

Related U.S. Application Data

(60) Provisional application No. 62/787,079, filed on Dec. 31, 2018.

(51) Int. Cl.
*H05K 7/20* (2006.01)
*H05K 7/14* (2006.01)

(52) U.S. Cl.
CPC ....... *H05K 7/20736* (2013.01); *H05K 7/1489* (2013.01)

(58) Field of Classification Search
CPC ............. H05K 7/20736; H05K 7/1489; H05K 7/20809; H05K 7/20772; H05K 7/20836; H05K 7/20272; H05K 7/20327; H05K 7/20781; H05K 7/1487; H05K 7/20145; H05K 1/142; H05K 1/144; H05K 5/0021; G06F 1/20; G06F 2200/201; G06F 1/185; G06F 1/184; G06F 1/181; G06F 1/206; H01L 23/467; H01L 23/46; F28F 13/02; F28F 2250/08
USPC ................. 361/679.48, 679.02, 679.46, 704; 165/104.33, 244, 287
See application file for complete search history.

(56) References Cited

U.S. PATENT DOCUMENTS

2008/0192454 A1* 8/2008 Knutsson ............. H05K 7/1425 361/796
2009/0097204 A1* 4/2009 Byers ................. H05K 7/20572 361/695

* cited by examiner

*Primary Examiner* — Mandeep S Buttar
(74) *Attorney, Agent, or Firm* — Plumsea Law Group, LLC

(57) ABSTRACT

A system to improve cooling of rack mounted components may include a first rack mounted component including a first motherboard, the first motherboard having a hot area that is generally hotter than other portions of the motherboard, the hot area proximate a first edge. In addition, the system may include a second rack mounted component disposed above the first rack mounted component; the second rack mounted component having a second motherboard, wherein the second motherboard is similar to the first motherboard; the second motherboard having a first edge; wherein the second motherboard is disposed above the first motherboard, and wherein the second motherboard is angled with respect to the first motherboard so that the first edge of the second motherboard is non-aligned with the first edge of the first motherboard.

14 Claims, 6 Drawing Sheets

205 500 505 400 201 310 202 415 203 420

COOLING SYSTEM FOR RACK MOUNTED ELECTRONIC COMPONENTS

CROSS-REFERENCE TO RELATED APPLICATIONS

This application claims priority to U.S. Provisional Patent Application No. 62/787,079, filed Dec. 31, 2018, the entire disclosure of which is hereby incorporated by reference.

TECHNICAL FIELD

The present disclosure generally relates to electrical component cooling systems and, more particularly, to systems and methods for cooling rack mounted electrical components.

BACKGROUND

Electronic equipment typically generates heat. Indoor areas that house multiple pieces of electronic equipment (such as server rooms, data centers, etc.) can generate significant amounts of heat such that the indoor areas require climate control, such as cooling. Air conditioning and other kinds of cooling measures, such as ventilation, fans, etc., are often used to ensure that the equipment does not overheat.

The heat generating elements of electronic components are often inside the electronic components, and thus, may be somewhat shielded from circulating cooling air. In addition, in some cases, electrical components may be rack mounted in a stack. When stacked as such, the electrical components generating heat in such proximity to one another may make it even more difficult to cool each individual component.

There is a need in the art for a system and method that addresses the shortcomings discussed above. In particular, there is a need in the art for a disaster condition monitoring system.

SUMMARY

In one aspect, the present disclosure is directed to a system to improve cooling of rack mounted components. The system may include a first rack mounted component including a first motherboard, the first motherboard having a hot area that is generally hotter than other portions of the motherboard, the hot area proximate a first edge. In addition, the system may include a second rack mounted component disposed above the first rack mounted component; the second rack mounted component having a second motherboard, wherein the second motherboard is similar to the first motherboard; the second motherboard having a first edge; wherein the second motherboard is disposed above the first motherboard, and wherein the second motherboard is angled with respect to the first motherboard so that the first edge of the second motherboard is non-aligned with the first edge of the first motherboard.

In another aspect, the present disclosure is directed to a method for improving cooling in a rack. The method may include the steps of: selecting a first rack mounted component, the first rack mounted component having a first motherboard attached to the first rack mounted component; the first motherboard having a first orientation; selecting a second rack mounted component, the second rack mounted component having a second motherboard; the second motherboard having a second orientation; wherein the second orientation is angularly offset by an offset angle from the first orientation of the first motherboard; and installing the second rack mounted component above the first rack mounted component.

Other systems, methods, features, and advantages of the disclosure will be, or will become, apparent to one of ordinary skill in the art upon examination of the following figures and detailed description. It is intended that all such additional systems, methods, features, and advantages be included within this description and this summary, be within the scope of the disclosure, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DESCRIPTION OF EMBODIMENTS

The present disclosure is directed to a cooling system for rack mounted electronic components. The disclosed system may include features for improving cooling and maximizing the cooling effect of airflow through rack mounted components. In particular, the disclosed system utilizes angled motherboards within the rack mounted components to produce a spiral airflow or vortex. This vortex may increase the flowrate of air through the components, and thus, provide greater cooling effect.

Figure 1:
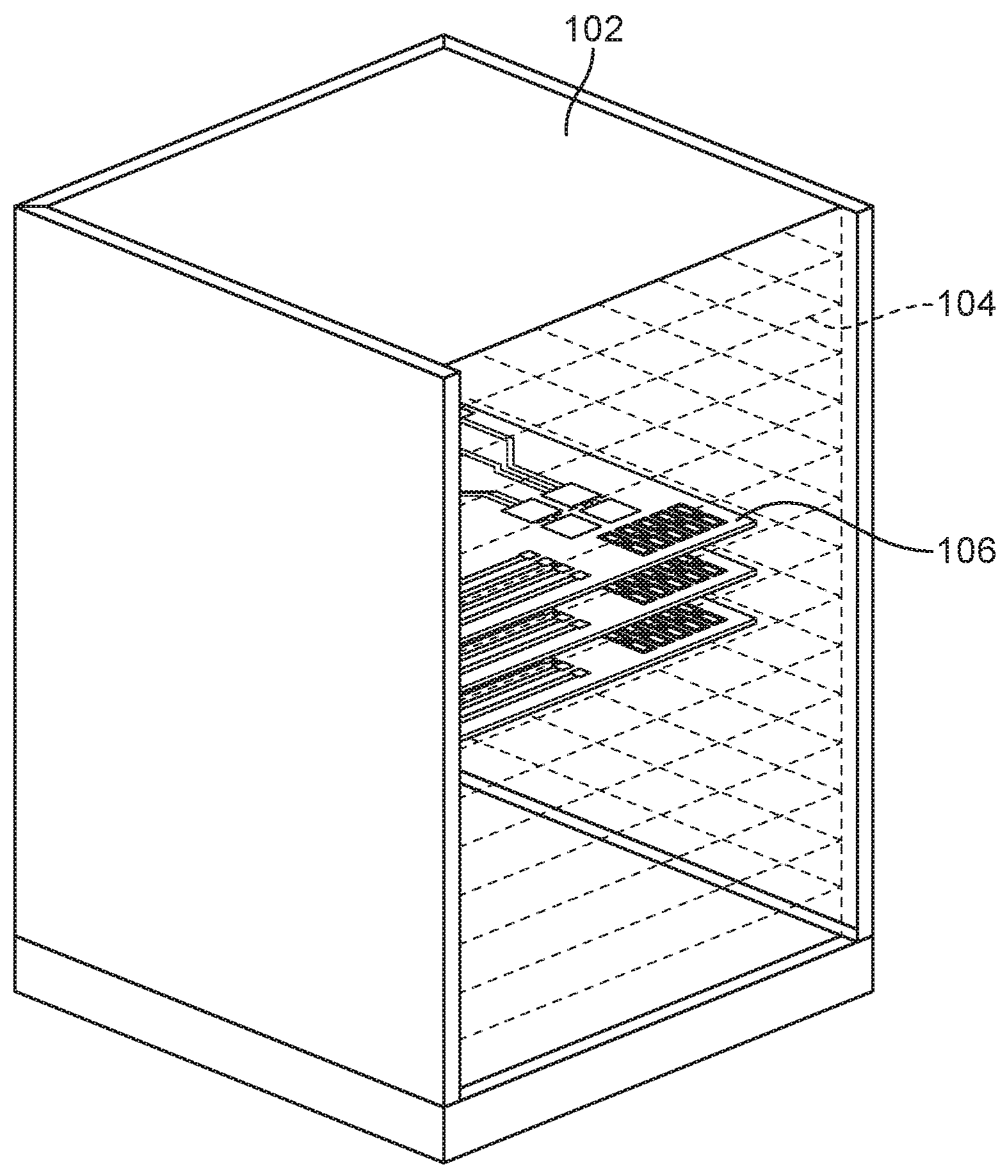
FIG. 1 is a schematic top perspective view of an embodiment of an electronic rack system shown with a side wall panel removed to expose motherboards arranged in the rack.

FIG. 1 is a schematic top perspective view of an electronic rack system shown with a side wall panel removed to expose motherboards arranged in the rack. As shown in FIG. 1, a server rack cabinet 102 may include a plurality of rack shelves 104 configured to support rack mounted components, such as servers. The servers may each include a motherboard, which may be disposed within a housing of each server. FIG. 1 shows a plurality of motherboards 106 as they would be disposed within cabinet 102, albeit without the corresponding housings for their respective rack mounted components. That is, the server housings have been omitted from FIG. 1 in order to illustrate the orientations of motherboards 106. As shown in FIG. 1, all of mother boards 106 are oriented at the same angle with respect to cabinet 102. In this case, all of mother boards 106 are generally aligned with the walls of server rack cabinet 102. To the extent any airflow is permitted up through the components that include motherboards 106, the airflow is disrupted and inconsistent across the different areas of motherboards 106 because each mother board has various componentry disposed on it, and thus, is asymmetrical.

Figure 2:
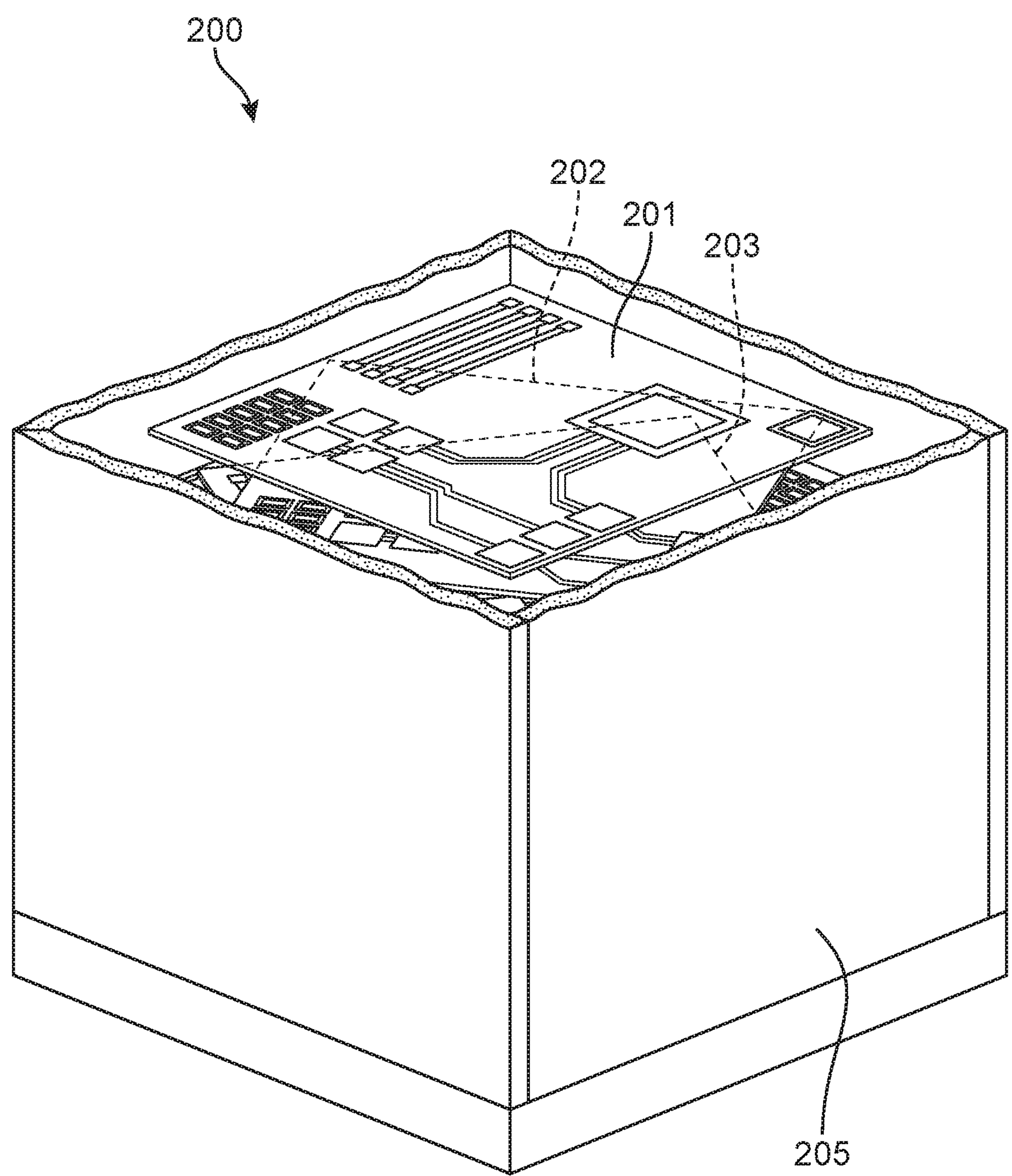
FIG. 2 is a schematic top perspective view of a rack system according to an exemplary embodiment, shown with a horizontal cutaway exposing motherboards arranged in the rack.

FIG. 2 is a schematic top perspective view of a rack cooling system according to an exemplary embodiment, shown with a horizontal cutaway exposing motherboards arranged in the rack. In FIG. 2, again the server housings have been omitted for purposes of illustrating the respective orientations of motherboards within the servers. As shown in FIG. 2, a cooling system 200 may include a server rack cabinet 205. Cabinet 205 may be configured to house a plurality of stacked rack mounted components. In some embodiments, the rack mounted components may include one or more servers. In some embodiments, the rack mounted components may include other electronic equipment, such as audio/visual equipment.

As shown in FIG. 2, the rack mounted components of system 200 may each include a motherboard. For example, a first motherboard 201 is shown at the top of the stack. A second motherboard 202 is shown one tier below first motherboard 201 and, as shown in FIG. 2, second mother board 202 may be disposed within its housing at an angle with respect to first mother board 201. Further, a third motherboard 203 is disposed within its housing at an angle with respect to second motherboard 202. When a flow of cooling air is delivered through these components, the spiral stacked arrangement of the motherboards may produce a vortex in the flow of cooling air. This vortex may increase the flow of cooling air through the components, and may also more evenly cool the various components of each motherboard.

Figure 3:
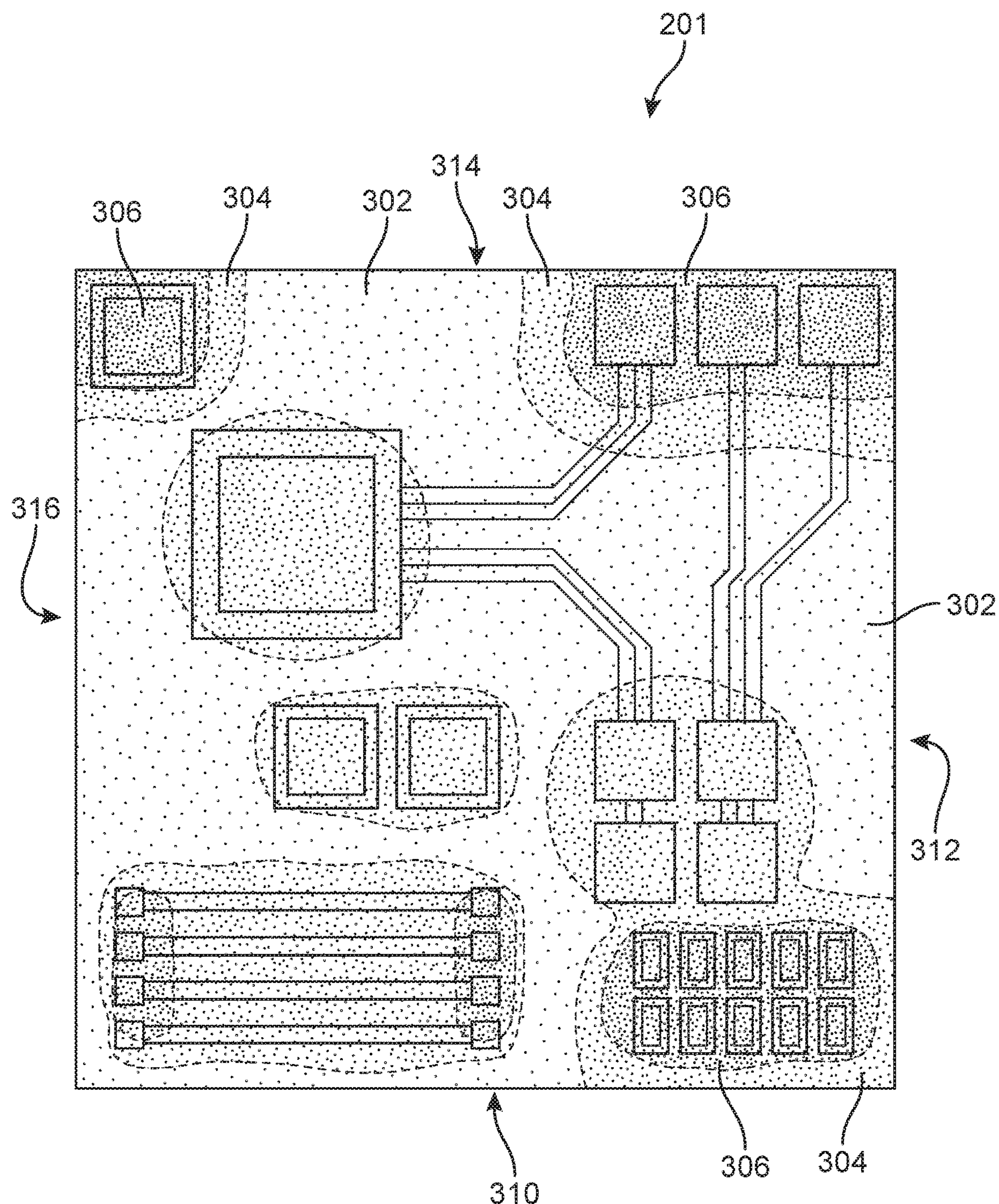
FIG. 3 is a schematic top view of a motherboard for an electrical component showing areas of different temperature levels.

FIG. 3 is a schematic top view of first motherboard 201, showing areas of different temperature levels. As shown in FIG. 3, first motherboard 201 may have a first edge 310, a second edge 312, a third edge 314, and a fourth edge 316. Although the motherboards are shown in the figures as being substantially square, the motherboards may have any suitable shape. For example, in some cases, one or more of the motherboards may be rectangular. In some cases, one or more of the motherboards may have an irregular shape.

The various components on each motherboard produce different amounts of heat. The stippled areas illustrated in FIG. 3 indicate areas of varying temperatures. As shown in FIG. 3, the sparsely stippled regions represent an ambient area 302 having a temperature that is substantially the same as the ambient air in the server room. Similarly, FIG. 3 shows a plurality of warm areas 304 and a plurality of hot areas 306. Hot areas 306 are densely stippled and are generally located in areas in which a motherboard component is disposed. In some cases, warm areas 304 may be located in areas that include motherboard components that generate less heat. In other cases, warm areas 304 may be located near, but not coincident with the components that generate the large amounts of heat in hot areas 306. As shown in FIG. 3, in some cases, hot areas 306 are located proximate the edges of motherboard 201.

Figure 4:
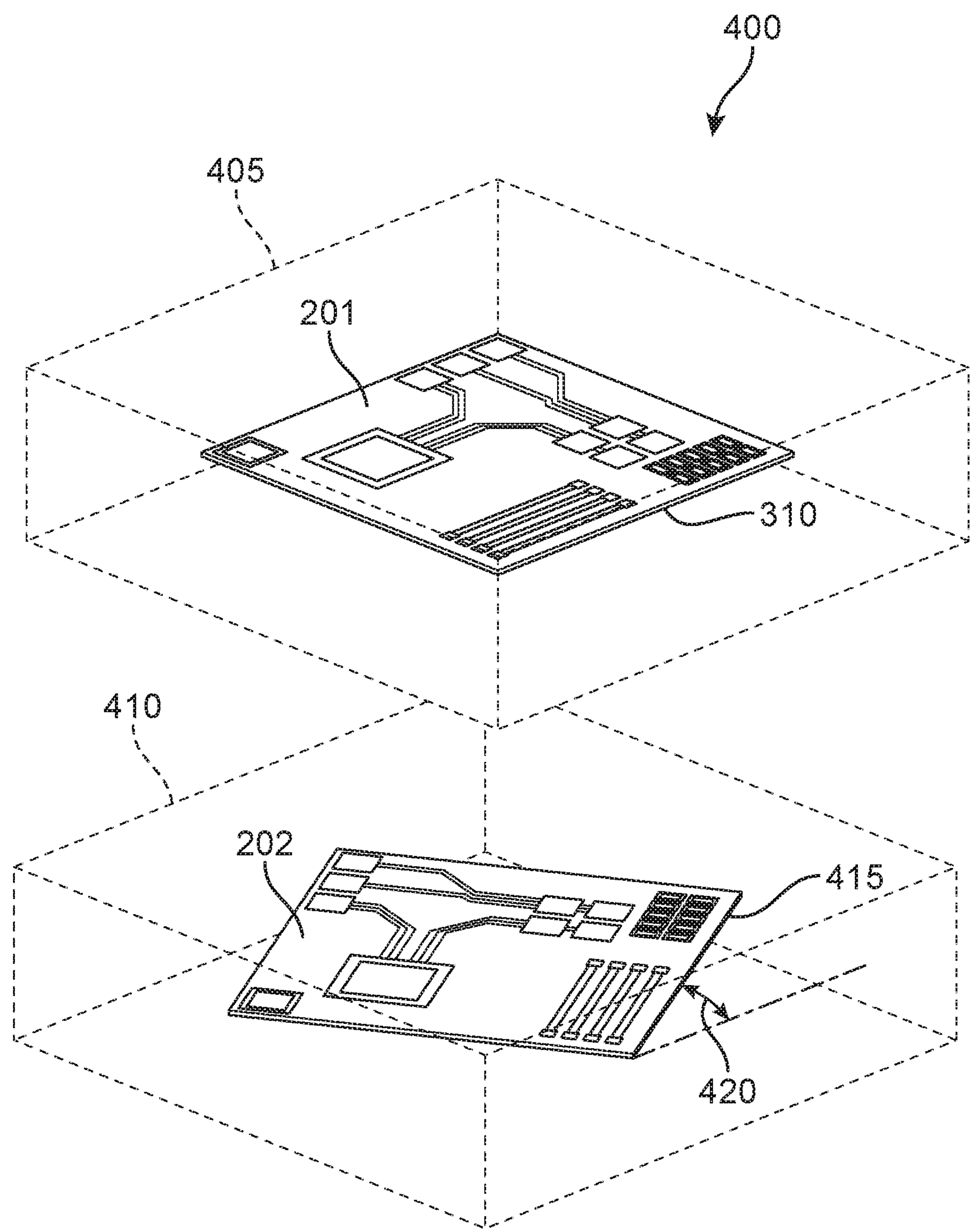
FIG. 4 is a schematic perspective view of two stacked rack mounted components.

FIG. 4 is a schematic perspective view of a system 400 including at least two stacked rack mounted components. In particular, FIG. 4 illustrates a first rack mounted component 405 and a second rack mounted component 410. First rack mounted component 405 and second rack mounted component 410 may be any of a variety of electronic components. In some embodiments, first rack mounted component 405 and second rack mounted component 410 may be servers. The housings of first rack mounted component 405 and second rack mounted component 410 are shown in dashed lines, in order to illustrate the orientations of the motherboards within these two components.

First motherboard 201 may be disposed within first rack mounted component 405. As shown in FIG. 4, the edges of first motherboard 201 may be substantially aligned with the walls of the housing of first rack mounted component 405. Second motherboard 202 may be disposed within second rack mounted component 410. As shown in FIG. 4, in some embodiments, second mother board 202 may be substantially similar to first motherboard 201. As also shown in FIG. 4, second mother board 201 may be oriented at an angle with respect to first motherboard 201 when first rack mounted component 405 and second rack mounted component 410 are oriented in the same direction, e.g., when both components are mounted in a rack. Accordingly, the edges of second motherboard 202 may be substantially non-aligned with the edges of first motherboard 201. For example, an angle 420 illustrates the non-alignment of first edge 310 of first motherboard 201 and a first edge 415 of second motherboard 202.

As shown in FIG. 4, first motherboard 201 is smaller than first rack mounted component 405. Similarly, second motherboard 202 is smaller than second rack mounted component 405. This enables second motherboard 202 to be oriented at an angle within second rack mounted component 405 and still fit within the component housing.

Figure 5:
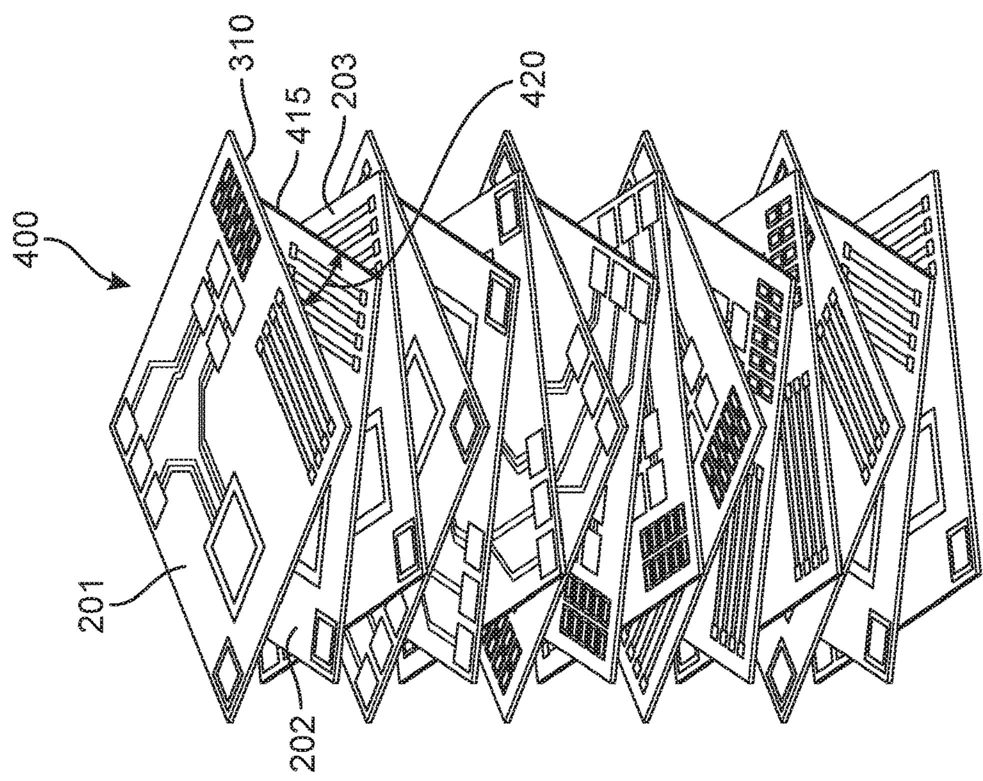
FIG. 5 is a schematic exploded view of a server rack and a spiral arrangement of motherboards.
Figure 5:
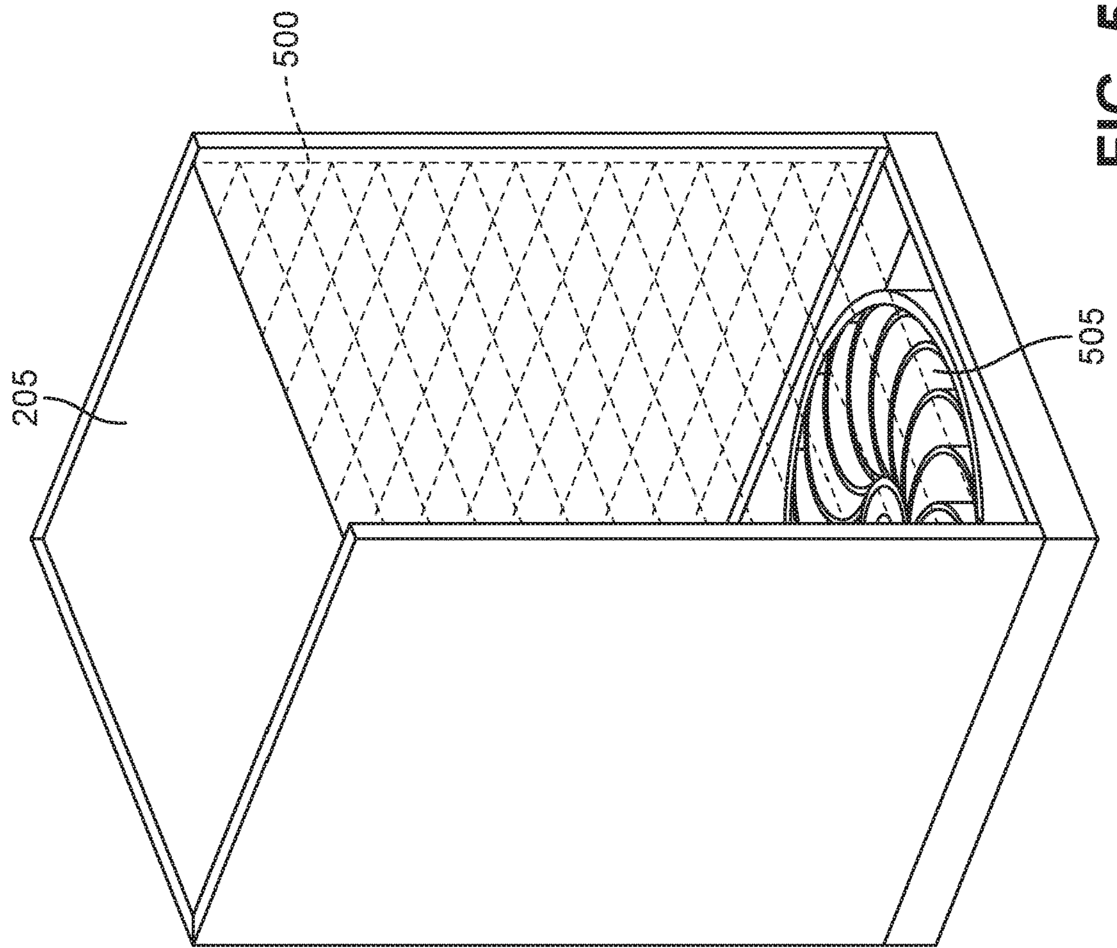
Figure 6:
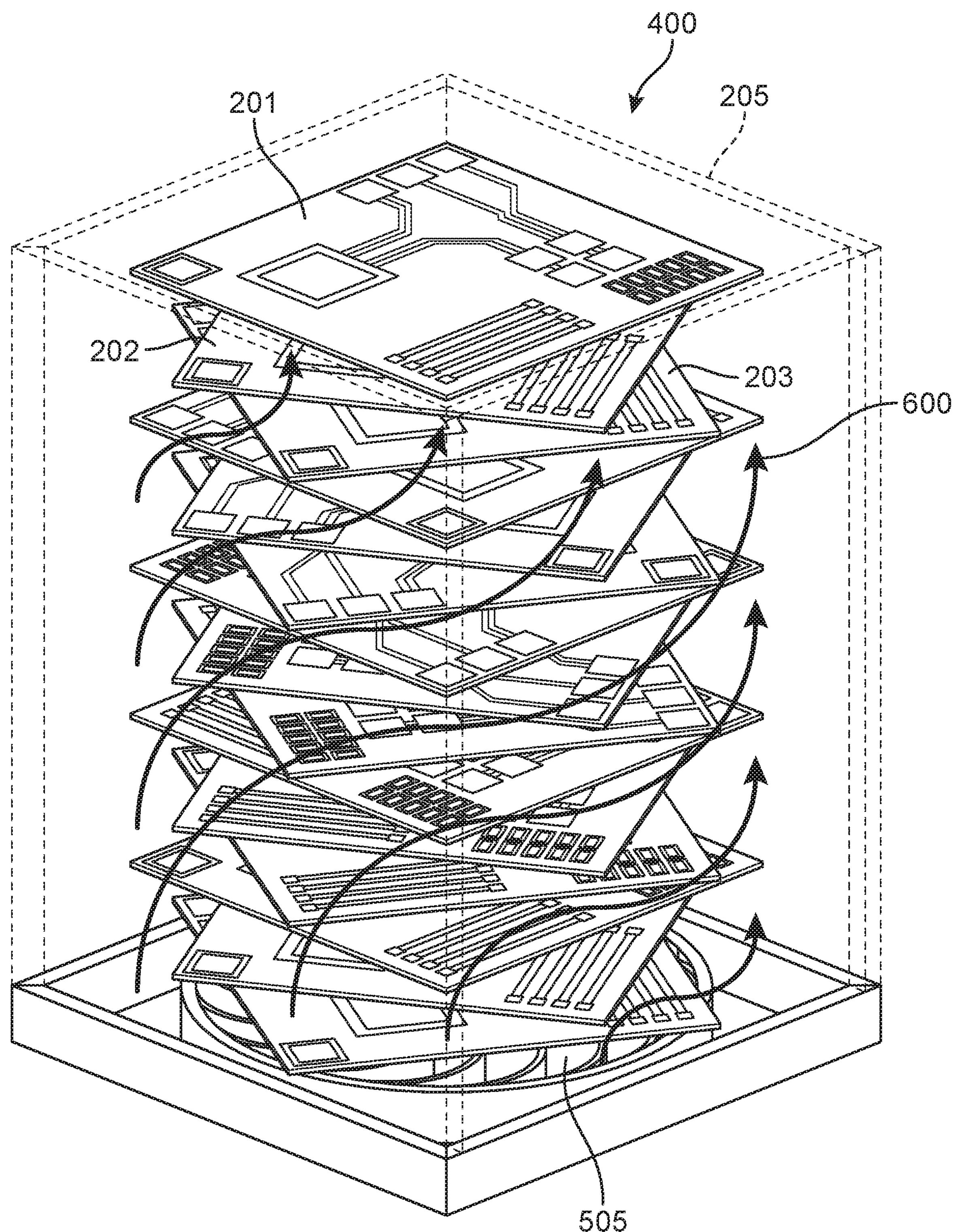
FIG. 6 is a schematic assembled view of the server rack and motherboards of FIG. 5.

FIG. 4 shows the non-alignment of the first two motherboards in system 400. FIGS. 2, 5, and 6 illustrate multiple non-aligned motherboards in a component stack, wherein each successive motherboard is oriented at an angle with respect to the motherboards in adjacent components.

For example, FIG. 5 is a schematic exploded view of a server rack and a spiral arrangement of motherboards as they would be disposed in a plurality of stacked rack mounted components. As shown in FIG. 5, second motherboard 202 is disposed at an angle with respect to first motherboard 201, third motherboard 203 is disposed at an angle with respect to second motherboard 202, and so forth. This creates a spiral configuration of the stacked motherboards.

In some embodiments, the stack of components including this spiral arrangement of motherboards may be disposed in a rack cabinet 205, for example, on a plurality of shelves 500. In some embodiments, cabinet 205 may include a bottom-mounted fan 505 for driving cooling air up through the components and motherboards.

The relative orientations of the motherboards with respect to one another creates a rotating airflow pattern (or vortex) as cooling air (from the fan or convection) rises from the bottom of the stack, through the motherboards. The rack mounted components may include air permeable bases that substantially permit vertical air flow through the rack mounted components.

FIG. 6 is a schematic assembled view of system 400. As shown in FIG. 6, the spiral arrangement of motherboards in the stack of components may create a rotating airflow pattern (or vortex) illustrated by a plurality of arrows 600. The rotating air flow may be substantially unimpeded by each successive rack mounted component. Accordingly, this rotating airflow may increase the flow rate and/or volumetric airflow through and around the motherboards in order to increase cooling as compared to the same fan-driven or convection airflow passing upwards through the components in a substantially vertical path.

A method for improving cooling in a rack may include selecting a first rack mounted component, the first rack mounted component having a first motherboard attached to the first rack mounted component; the first motherboard having a first orientation. In addition, the method may include selecting a second rack mounted component, the second rack mounted component having a second motherboard; the second motherboard having a second orientation; wherein the second orientation is angularly offset by an offset angle from the first orientation of the first motherboard. Further, the method may include installing the second rack mounted component above the first rack mounted component. In some embodiments, the method may include producing the vertical air flow directed towards the first rack mounted component with a vertical flow fan beneath the first rack mounted component.

Also, the method may further include the step of selecting a third rack mounted component, the third rack mounted component having a third motherboard; the third motherboard having a third orientation; wherein the third orientation is angularly offset by the offset angle from the second orientation of the second motherboard; and installing the third rack mounted component above the second rack mounted component.

The method may further include the step of selecting a fourth rack mounted component, the fourth rack mounted component having a fourth motherboard; the fourth motherboard having a fourth orientation; wherein the fourth orientation is angularly offset by the offset angle from the third orientation of the third motherboard; and installing the fourth rack mounted component above the third rack mounted component.

While various embodiments have been described, the description is intended to be exemplary, rather than limiting, and it will be apparent to those of ordinary skill in the art that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with, or substituted for, any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

We claim:

1. A system to improve cooling of rack mounted components, comprising: a first rack mounted component including a first motherboard, the first motherboard having a hot area that is generally hotter than other portions of the motherboard, the hot area proximate a first edge; and a second rack mounted component disposed above the first rack mounted component; the second rack mounted component having a second motherboard, wherein the second motherboard is similar to the first motherboard; the second motherboard having a first edge; wherein the second motherboard is disposed above the first motherboard, and wherein the second motherboard is angled with respect to the first motherboard so that the first edge of the second motherboard is non-aligned with the first edge of the first motherboard; and wherein a relative orientation of the second motherboard with respect to the first motherboard creates a rotating airflow pattern as cooling air rises from the first motherboard to the second motherboard.

2. The system according to claim 1, further comprising a third rack mounted component disposed above the second rack mounted component; the third rack mounted component having a third motherboard, wherein the third motherboard is similar to the first motherboard; the third motherboard having a first edge.

3. The system according to claim 2, wherein the third motherboard is disposed above the second motherboard, and wherein the third motherboard is angled with respect to the second motherboard so that the first edge of the third motherboard is non-aligned with the first edge of the second motherboard.

4. The system according to claim 1, wherein the first motherboard is smaller than the first rack mounted component.

5. The system according to claim 1, further including a vertical flow fan disposed beneath the first rack mounted component.

6. The system according to claim 1, wherein the first rack mounted component includes an air permeable base that substantially permits vertical air flow through the first rack mounted component.

7. The system according to claim 6, wherein the second rack mounted component includes an air permeable base that substantially permits vertical air flow through the second rack mounted component.

8. The system according to claim 1, wherein the first rack mounted component is a server.

9. A method for improving cooling in a rack comprising the steps of: selecting a first rack mounted component, the first rack mounted component having a first motherboard attached to the first rack mounted component; the first motherboard having a first orientation; selecting a second rack mounted component, the second rack mounted component having a second motherboard; the second motherboard having a second orientation; wherein the second orientation is angularly offset by an offset angle from the first orientation of the first motherboard; and installing the second rack mounted component above the first rack mounted component; wherein a rotating air flow is created by the offset angle of the second motherboard with respect to the first motherboard.

10. The method according to claim 9, further comprising the step of selecting a third rack mounted component, the third rack mounted component having a third motherboard; the third motherboard having a third orientation; wherein the third orientation is angularly offset by the offset angle from the second orientation of the second motherboard; and installing the third rack mounted component above the second rack mounted component.

11. The method according to claim 10, further comprising the step of selecting a fourth rack mounted component, the fourth rack mounted component having a fourth motherboard; the fourth motherboard having a fourth orientation; wherein the fourth orientation is angularly offset by the offset angle from the third orientation of the third motherboard.

12. The method according to claim 11, further including installing the fourth rack mounted component above the third rack mounted component.

13. The method according to claim 9, wherein the rotating air flow is unimpeded by the second rack mounted component.

14. The method according to claim 9, further including producing a vertical air flow directed towards the first rack mounted component with a vertical flow fan beneath the first rack mounted component.

* * * * *